United States Patent
Gallup et al.

(10) Patent No.: US 7,520,679 B2
(45) Date of Patent: Apr. 21, 2009

(54) OPTICAL DEVICE PACKAGE WITH TURNING MIRROR AND ALIGNMENT POST

(75) Inventors: Kendra Gallup, Marina Del Rey, CA (US); Brenton A. Baugh, Palo Alto, CA (US); Robert E. Wilson, Palo Alto, CA (US); James A. Matthews, Milpitas, CA (US); Christopher L. Coleman, Santa Clara, CA (US); Tanya J. Snyder, Edina, MN (US); James H. Williams, Walnut Creek, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/665,680

(22) Filed: Sep. 19, 2003

(65) Prior Publication Data

US 2005/0063642 A1    Mar. 24, 2005

(51) Int. Cl.
G02B 6/36 (2006.01)
H01S 3/00 (2006.01)
G02B 6/32 (2006.01)
H01L 21/00 (2006.01)

(52) U.S. Cl. ............... 385/88; 257/98; 257/432; 257/433; 372/109; 385/33; 438/106

(58) Field of Classification Search ............... 385/88, 385/33
See application file for complete search history.

(56) References Cited

U.S. PATENT DOCUMENTS

| | | | |
|---|---|---|---|
| 3,816,847 A | 6/1974 | Nagao | |
| 4,307,934 A | 12/1981 | Palmer | |
| 4,680,733 A | 7/1987 | Duforestel et al. | |
| 4,847,848 A | 7/1989 | Inoue et al. | |
| 4,966,430 A | 10/1990 | Weidel | |

(Continued)

FOREIGN PATENT DOCUMENTS

DE    3834335    4/1990

(Continued)

OTHER PUBLICATIONS

Chien Chieh Lee et al., "Silicon-Based Transmissive Diffractive Optical Element", Optics Letters, vol. 28, No. 14, Jul. 15, 2003, Optical Society of America, pp. 1260-1262.

(Continued)

*Primary Examiner*—Frank G Font
*Assistant Examiner*—Erin D Chiem

(57) ABSTRACT

An optoelectronic package or sub-assembly includes an edge-emitting laser and a reflector that directs a beam from the laser through a sub-mount. The sub-mount contains passive or active circuit elements that are electrically connected to the laser. The laser can be protected from the environment using either a cap in which the reflector is integrated or using an encapsulant encasing the laser. An alignment post that is sized to fit into a sleeve is mounted where the optical signal emerges from the sub-mount. Plugging the post into one end of the sleeve and inserting an optical fiber into the other end of the sleeve so that the optical fiber abuts the post will then align the optical fiber to receive the optical signal.

13 Claims, 4 Drawing Sheets

U.S. PATENT DOCUMENTS

| | | | |
|---|---|---|---|
| 4,993,799 A | 2/1991 | Stein | |
| 5,104,242 A | 4/1992 | Ishikawa | |
| 5,195,156 A * | 3/1993 | Freeman et al. | 385/92 |
| 5,390,271 A | 2/1995 | Priest | |
| 5,394,490 A | 2/1995 | Kato et al. | |
| 5,394,498 A | 2/1995 | Hinterlong et al. | |
| 5,485,021 A | 1/1996 | Abe | |
| 5,512,860 A | 4/1996 | Huscroft et al. | |
| 5,513,289 A | 4/1996 | Hosokawa et al. | |
| 5,532,524 A | 7/1996 | Townsley et al. | |
| 5,552,918 A | 9/1996 | Krug et al. | |
| 5,565,672 A | 10/1996 | Siegel et al. | |
| 5,566,265 A | 10/1996 | Spaeth et al. | |
| 5,577,142 A | 11/1996 | Mueller-Fiedler et al. | |
| 5,578,863 A | 11/1996 | De Poorter | |
| 5,581,414 A | 12/1996 | Snyder | |
| 5,602,855 A | 2/1997 | Whetsel, Jr. | |
| 5,665,982 A | 9/1997 | Torikai | |
| 5,742,833 A | 4/1998 | Dea et al. | |
| 5,781,422 A | 7/1998 | Lavin et al. | |
| 5,801,402 A | 9/1998 | Shin | |
| 5,822,352 A * | 10/1998 | Mizutani et al. | 372/50 |
| 5,835,514 A | 11/1998 | Yuen et al. | |
| 5,867,620 A * | 2/1999 | Bunin et al. | 385/53 |
| 5,875,205 A | 2/1999 | Spaeth et al. | |
| 5,883,988 A * | 3/1999 | Yamamoto et al. | 385/14 |
| 5,912,872 A | 6/1999 | Feldman | |
| 5,917,976 A | 6/1999 | Yamaguchi | |
| 5,940,564 A | 8/1999 | Jewell | |
| 5,956,370 A | 9/1999 | Ducaroir et al. | |
| 5,981,945 A | 11/1999 | Spaeth et al. | |
| 5,998,982 A | 12/1999 | Groeneveld et al. | |
| 6,016,548 A | 1/2000 | Nakamura et al. | |
| 6,036,872 A | 3/2000 | Wood et al. | |
| 6,037,641 A | 3/2000 | Goel | |
| 6,047,380 A | 4/2000 | Nolan et al. | |
| 6,079,025 A | 6/2000 | Fung | |
| 6,085,048 A | 7/2000 | Mikoshiba et al. | |
| 6,085,328 A | 7/2000 | Klein et al. | |
| 6,089,456 A | 7/2000 | Walsh et al. | |
| 6,115,763 A | 9/2000 | Douskey et al. | |
| 6,126,325 A | 10/2000 | Yamane et al. | |
| 6,144,787 A | 11/2000 | Johnston et al. | |
| 6,187,211 B1 | 2/2001 | Smith et al. | |
| 6,201,829 B1 | 3/2001 | Schneider | |
| 6,228,675 B1 | 5/2001 | Ruby et al. | |
| 6,230,277 B1 | 5/2001 | Nakaoka et al. | |
| 6,234,687 B1 | 5/2001 | Hall et al. | |
| 6,243,508 B1 | 6/2001 | Jewell et al. | |
| 6,265,246 B1 | 7/2001 | Ruby et al. | |
| 6,267,515 B1 | 7/2001 | Okuda et al. | |
| 6,274,890 B1 | 8/2001 | Oshio et al. | |
| 6,275,513 B1 | 8/2001 | Chang-Hasnain et al. | |
| 6,303,922 B1 | 10/2001 | Kasper | |
| 6,310,364 B1 | 10/2001 | Uemura | |
| 6,354,747 B1 | 3/2002 | Irie et al. | |
| 6,376,280 B1 | 4/2002 | Ruby et al. | |
| 6,416,238 B1 | 7/2002 | Gilliland et al. | |
| 6,422,766 B1 | 7/2002 | Althaus et al. | |
| 6,429,511 B2 | 8/2002 | Ruby et al. | |
| 6,445,514 B1 | 9/2002 | Ohnstein et al. | |
| 6,460,143 B1 | 10/2002 | Howard et al. | |
| 6,540,412 B2 | 4/2003 | Yonemura et al. | |
| 6,556,608 B1 | 4/2003 | Gilliland et al. | |
| 6,567,439 B1 | 5/2003 | Auracher et al. | |
| 6,567,590 B1 * | 5/2003 | Okada et al. | 385/49 |
| 6,599,666 B2 | 7/2003 | Rolfson | |
| 6,608,476 B1 | 8/2003 | Mirov et al. | |
| 6,652,158 B2 | 11/2003 | Bartur et al. | |
| 6,684,033 B1 | 1/2004 | Doh et al. | |
| 6,686,580 B1 | 2/2004 | Glenn et al. | |
| 6,731,882 B1 * | 5/2004 | Althaus et al. | 398/139 |
| 6,757,308 B1 | 6/2004 | Eldring et al. | |
| 6,759,723 B2 | 7/2004 | Silverbrook | |
| 6,774,404 B2 | 8/2004 | Imai | |
| 6,777,263 B1 | 8/2004 | Gan et al. | |
| 6,801,196 B1 | 10/2004 | Bodley et al. | |
| 6,818,464 B2 * | 11/2004 | Heschel | 438/22 |
| 6,874,107 B2 | 3/2005 | Lesea | |
| 6,947,224 B2 | 9/2005 | Wang et al. | |
| 6,977,960 B2 | 12/2005 | Takinosawa | |
| 6,979,810 B2 | 12/2005 | Chujo et al. | |
| 6,980,823 B2 | 12/2005 | Challa et al. | |
| 7,134,032 B2 | 11/2006 | Yamada et al. | |
| 2001/0023920 A1 * | 9/2001 | Ando et al. | 250/227.11 |
| 2002/0008326 A1 | 1/2002 | Mizusaki | |
| 2002/0101641 A1 | 8/2002 | Kurchuk | |
| 2002/0152408 A1 | 10/2002 | Inui et al. | |
| 2002/0179921 A1 | 12/2002 | Cohn | |
| 2003/0071283 A1 | 4/2003 | Heschel | |
| 2003/0089902 A1 | 5/2003 | Yue | |
| 2003/0116825 A1 | 6/2003 | Geefay et al. | |
| 2003/0119308 A1 | 6/2003 | Geefay et al. | |
| 2003/0142914 A1 | 7/2003 | Jewell et al. | |
| 2003/0160256 A1 | 8/2003 | Durocher et al. | |
| 2004/0086011 A1 * | 5/2004 | Bhandarkar | 372/43 |
| 2004/0190836 A1 * | 9/2004 | Kilian | 385/92 |
| 2005/0019042 A1 | 1/2005 | Kaneda | |
| 2005/0052255 A1 | 3/2005 | Chiang | |
| 2005/0058222 A1 | 3/2005 | Black et al. | |
| 2005/0134349 A1 | 6/2005 | Krishnaswami | |
| 2005/0191059 A1 | 9/2005 | Swenson et al. | |
| 2006/0115280 A1 | 6/2006 | Chang | |
| 2007/0019966 A1 | 1/2007 | Chiu et al. | |
| 2007/0047963 A1 | 3/2007 | Dallesasse | |
| 2007/0127929 A1 | 6/2007 | Nishihara et al. | |
| 2007/0154147 A1 | 7/2007 | Weem | |
| 2007/0154225 A1 | 7/2007 | Schulz | |
| 2007/0166047 A1 | 7/2007 | Berger | |
| 2007/0206964 A1 | 9/2007 | Lee et al. | |

FOREIGN PATENT DOCUMENTS

| | | |
|---|---|---|
| DE | 4440935 A1 | 5/1996 |
| DE | 19810624 | 3/1998 |
| DE | 19508222 | 6/1998 |
| DE | 19810624 | 9/1999 |
| DE | 19823691 | 12/1999 |
| DE | 10150401 | 10/2001 |
| EP | 0366974 A1 | 7/1989 |
| EP | 0713113 | 5/1996 |
| EP | 0942302 | 9/1999 |
| EP | 1104113 | 5/2001 |
| EP | 1187373 A2 | 3/2002 |
| EP | 1199697 | 4/2002 |
| EP | 1187373 A3 | 1/2005 |
| JP | 2007/020008 | 1/2007 |
| WO | WO98/50810 A1 | 11/1998 |
| WO | WO-01/01497 | 1/2001 |
| WO | WO2004/042320 | 5/2004 |

OTHER PUBLICATIONS

U.S. Appl. No. 10/210,598, filed Jul. 31, 2002 entitled "Optical Fiber Coupler Having A Relaxed Alignment Tolerance," Inventor: Christopher L. Coleman, 17 pages.

U.S. Appl. No. 10/208,570, filed Jul. 30, 2002 entitled "Diffractive Optical Elements And Methods of Making the Same", Inventors: James A. Matthews, Wayne H. Grubbs, 18 pages.

U.S. Appl. No. 10/277,479, filed Oct. 22, 2002 entitled "Method for Sealing a Semiconductor Device and Apparatus Embodying the Method", Inventor: Frank S. Geefay, 15 pages.

German Office Action dated Feb. 15, 2007 involving counterpart German Patent Application No. 10 2004 025 661.6-54.

English translation of German Office Action dated Mar. 23, 2007 involving counterpart German Patent Application No. 10 2004 025 661.6-54.

Agilent Technologies, Inc., "Gigabit Ethernet and Fibre Channel SerDes ICs", *Technical Data Sheet*, (Apr. 2000).

"German Office Action involving counterpart German Patent Application", No. 102004025775, (Feb. 16, 2007),2-54.

"English Translation of German Office Action involving counterpart German Patent Application", No. 102004025775, (Feb. 16, 2007),2-54.

Sklar, B. "Digital Communications: Fundamentals and Applications", *2nd Ed.*, Upper Saddle River, NJ: *Prentice Hall PTR*, (2001).

Sialm, et al., "Ultra-Fast CMOS Transceiver Design for Optical Interconnect Applications", Website: www.ife.ee.ethz.ch/rfic/ Link: 10 Gbit/s Optolink.

Pepeljugoski, P. et al., "Improved Performance of 10 Gb/s Multimode Fiber Optic Links Using Equalization", *Optical Fiber Communications Conference, OFC 2003*, vol. 2., (Mar. 23-28, 2003),472-474.

Pallotta, Andrea et al., "A Low-Power Clock and Data Recovery Circuit for 2.5 Gb/s SDH Receivers", *ISLPED*, Rapallo, Italy, (2000),67-72.

Takeshita, T. "A 622Mb/s Fully-Integrated Optical IC with a Wide Range Input", *IEEE, International Solid-State Circuits Conference*, (2002).

"German Office Action; involving counterpart German Patent Application", No. 10 2004 028 117, (Nov. 2, 2006),3-54.

"English translation of German Office Action; involving counterpart German Patent Application", No. 10 2004 028 117, (Nov. 2, 2006),3-54.

"German Office Action; involving counterpart German Patent Application", No. 10 2004 028 117, (Mar. 20, 2007),3-54.

"English translation of German Office Action; involving German Patent", No. 10 2004 028 117, (Mar. 20, 2007),3-54.

"German Office Action; involving counterpart German Patent Application No.", 102004026990, (Feb. 21, 2007),4-54.

"English translation of German Office Action involving counterpart German Patent Application No.", 102004026990, (Feb. 21, 2007),4-54.

Kim, S.E. "CMOS optical receiver chipset for gigabit ethernet applications.", *Proceedings of the 2003 International Symposium on Circuits and Systems*, ISCAS '03., vol. 1: 1-29 to 1-32.,(May 2003),25-28.

* cited by examiner

OPTICAL DEVICE PACKAGE WITH TURNING MIRROR AND ALIGNMENT POST

This patent document is related to and hereby incorporates by reference in their entirety the following co-filed U.S. patent applications: Ser. No. 10/666,319, entitled "Alignment Post for Optical Subassemblies Made With Cylindrical Rods, Tubes, Spheres, or Similar Features"; Ser. No. 10/666,363, entitled "Wafer-Level Packaging of Optoelectronic Devices"; Ser. No. 10/666,442, entitled "Integrated Optics and Electronics"; Ser. No. 10/666,444, entitled "Methods to Make Diffractive Optical Elements"; Ser. No. 10/666,091, entitled "Optoelectronic Device Packaging With Hermetically Sealed Cavity and Integrated Optical Element"; Ser. No. 10/665,662, entitled "Surface Emitting Laser Package Having Integrated Optical Element and Alignment Post"; and Ser. No. 10/665,660, entitled "Optical Receiver Package".

BACKGROUND

Semiconductor optoelectronic devices such as laser diodes for optical transceivers can be efficiently fabricated using wafer processing techniques. Generally, wafer processing techniques simultaneously form a large number (e.g., thousands) of devices on a wafer. The wafer is then cut to separate individual chips. Simultaneous fabrication of a large number of chips keeps the cost per chip low, but each chip generally must be packaged and/or assembled into a system that protects the chip and provides both electrical and optical interfaces for use of the devices on the chip.

Assembly of a package or a system containing an optoelectronic device is often costly because of the need to align multiple optical components with a semiconductor device. For example, the transmitting side of an optical transceiver chip may include a Fabry Perot laser that emits an optical signal from an edge of the chip. However, a desired path of the optical signal may require light to emerge from another direction, e.g., the face of a package. A turning mirror can deflect the optical signal from its original direction to the desired direction. Additionally, a lens or other optical element may be necessary to focus or alter the optical signal and improve coupling of the optical signal into an external optical fiber. Alignment of a turning mirror to the edge of the chip, the lens to the turning mirror, and an optical fiber to the lens can be a time consuming/expensive process.

Wafer-level packaging is a promising technology for reducing the size and the cost of the packaging of optoelectronic devices. With wafer-level packaging, components that conventionally have been separately formed and attached are instead fabricated on a wafer that corresponds to multiple packages. The resulting structures can be attached either individually or simultaneously and later cut to separate individual packages.

Packaging techniques and structures that can reduce the size and/or cost of optoelectronic assemblies are sought.

SUMMARY

In accordance with an aspect of the invention, a reflector and an edge-emitting laser are attached to a sub-mount. The sub-mount includes passive or active electrical components that electrically connect to the laser. The sub-mount may further include optical elements, and the reflector is positioned to reflect an optical signal from the laser through the sub-mount. An alignment post can then be mounted on the sub-mount where the optical signal emerges. Inserting the post into one end of a sleeve and inserting a ferrule containing an optical fiber into the opposite end of the sleeve will align the two thus achieving efficient coupling of the optical signal into the optical fiber.

The laser can be protected by a transparent encapsulant that is deposited on the sub-mount to encase the laser. Alternatively, a cap can attach to the sub-mount to form a cavity enclosing the laser, and the reflector can be built into the cap as a reflective portion of the cavity wall.

One specific embodiment of the invention is a device including a sub-mount, an edge-emitting laser, and a reflector. The sub-mount includes conductive traces, and the edge-emitting laser is electrically coupled to the conductive traces. The reflector is positioned to reflect the optical signal from the edge-emitting laser through the sub-mount. An alignment post can be attached to the sub-mount where the optical signal emerges. Additionally, an optical element such as a diffractive lens can be attached in the path of the optical signal or integrated into the sub-mount along the path of the optical signal.

In one variation of this embodiment, the reflector is a reflective portion of an interior wall of a cap that attaches to the sub-mount to hermetically seal the laser inside a cavity. Alternatively, a transparent encapsulant such as silicone can be applied to the sub-mount to encase and protect the laser.

BRIEF DESCRIPTION OF THE DRAWINGS

Use of the same reference symbols in different figures indicates similar or identical items.

DETAILED DESCRIPTION

In accordance with an aspect of the invention, a package for an edge-emitting laser includes a sub-mount and a reflector that directs an optical signal from the laser through the sub-mount. The sub-mount can be a semiconductor substrate that includes passive or active circuit elements that attach to the die. An alignment post can be attached to the sub-mount where the optical signal emerges after reflection from the reflector. The reflector can be either a separate element or can be part of a cap that attaches to the sub-mount hermetically sealing the laser in a cavity. When the reflector is a separate element, a transparent encapsulant can be applied to the laser and the sub-mount to protect the laser.

A wafer-level fabrication process for these packages attaches multiple lasers to a sub-mount wafer. Reflectors are attached to the sub-mount wafer at positions to reflect optical signals from respective lasers. The reflectors can either be separate elements or may be reflective parts of cavities in a cap wafer. Environmental protection of the dice can either be provided by an encapsulant that is applied to encase the lasers or by hermetically sealing cavities formed by attaching a cap wafer to the sub-mount wafer. The sub-mount wafer is cut to separate individual packages. Alignment posts can be attached to the sub-mounts before or after separation of the packages to simplify alignment of the packages in an optical subassembly (OSA).

Figure 1:
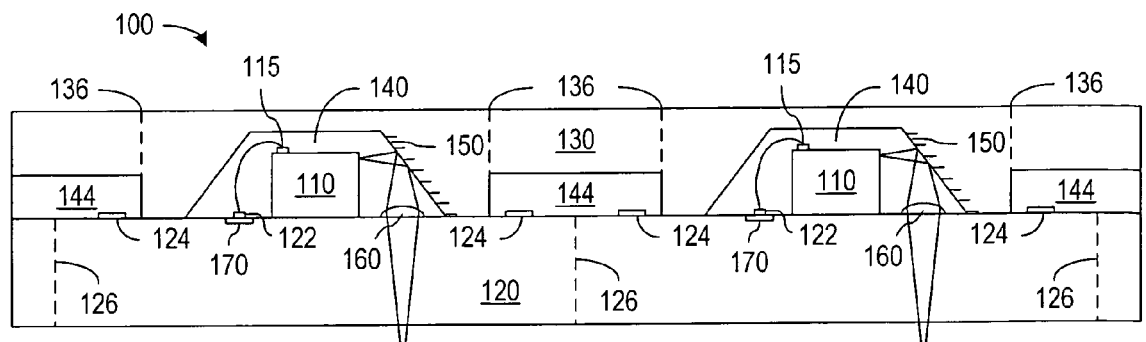
FIG. 1 shows a cross-section of a portion of a structure formed during a wafer-level packaging process for semiconductor optical devices in accordance with an embodiment of the invention employing wire bonding for electrical connections.

FIG. 1 shows a structure 100 produced during a wafer-level packaging process in accordance with one embodiment of the invention. Structure 100 includes multiple edge emitting lasers 110. Lasers 110 can be of a conventional design and manufactured using techniques that are well known in the art. In one specific embodiment, each laser 110 is a Fabry Perot laser for use in the transmitting section of an optical transmitter.

Each laser 110 is within one of the cavities 140 formed between a sub-mount wafer 120 and a cap wafer 130. In the embodiment of FIG. 1, lasers 110 are attached and electrically connected to sub-mount wafer 120. Lasers 110 can be glued or otherwise affixed in the desired location using conventional die attach equipment. In structure 100, wire bonding connects bonding pads 115 on lasers 110 to internal bonding pads 122 on wafer 120.

Wafer 120 is predominantly made of silicon and/or other materials that are transparent to the wavelength (e.g., 1100 nm or longer) of the optical signals from lasers 110. Wafer 120 also includes circuit elements such as bonding pads 122, electrical traces 170, or vias (not shown) that connect lasers 110 to external terminals 124. In the illustrated embodiment, external terminals 124 are on the top surface of sub-mount wafer 120, but the external terminals could alternatively be provided on the bottom surface. Additionally, active devices (not shown) such as transistors, an amplifier, or a monitor/sensor can be incorporated in wafer 120.

Cap wafer 130 is fabricated to include depressions or cavities 140 in areas corresponding to lasers 110 on sub-mount wafer 120 and saw channels 144 in areas over external terminals 124. Wafer 130 can be made of silicon or any convenient material that is suitable for formation of cavities 140 of the desired shape. Cavities 140 can be formed in a variety of ways including but not limited to forming, coining, ultrasonic machining, and (isotropic, anisotropic, or plasma) etching.

All or part of the surface of cap wafer 130 including cavities 140 is either reflective or coated with a reflective material so that reflectors 150 are integrated into cap wafer 130 in the required locations to reflect optical signals from lasers 110 to the desired direction. In an exemplary embodiment, deposition of a reflective metal forms reflectors 150, but the metal may be restricted to selected areas to avoid wicking when solder bonds wafers 120 and 130 together. Reflectors 150 can be planar to merely reflect or turn the optical signal to the desired direction but can alternatively be non-planar to provide beam shaping if desired.

In an exemplary embodiment, cap wafer 130 is silicon, and anisotropic etching of the silicon forms cavities 140 having very smooth planar facets on the <111> planes of the silicon crystal structure. Reflectors 150 are facets coated with a reflective material such as a Ti/Pt/Au metal stack. The preferred angle of reflectors 150 is 45° relative to the surface of wafer 130, so that reflectors 150 reflect optical signals that lasers 110 emit parallel to the surface of wafer 120 to a direction perpendicular to the surface of sub-mount wafer 120. A silicon wafer that is cut off-axis by 9.74° can be used to achieve a 45° angle for each reflector 150. However, etching silicon that is cut on-axis or off-axis at different angles can produce reflectors 150 at angles, which may be suitable for many applications.

Optionally, optical elements 160 such as lenses or prisms can be attached to or integrated into sub-mount wafer 120 along the paths of the optical signals from lasers 110. In FIG. 1, optical elements 160 are lenses that are integrated into wafer 120 and serve to focus the optical signals for better coupling into an optical fiber or other optical device not shown in FIG. 1. U.S. patent application Ser. No. 10/210,598, entitled "Optical Fiber Coupler Having a Relaxed Alignment Tolerance," discloses bifocal diffractive lenses suitable for optical elements 160 when coupling of the optical signals into optical fibers is desired.

Sub-mount wafer 120 and cap wafer 130 are aligned and bonded together. A variety of wafer bonding techniques including but not limited to soldering, bonding by thermal compression, or bonding with an adhesive could be employed for attaching wafers 120 and 130. In the exemplary embodiment of the invention, soldering using a gold/tin eutectic solder attaches wafers 120 and 130 to each other and hermetically seals cavities 140. Hermetic seals on cavities 140 protect the enclosed lasers 110 from environmental damage.

After wafers 120 and 130 are bonded, structure 100 can be cut to produce individual packages, each including a laser 110 hermetically sealed in a cavity 140. In particular, saw channels 144 permit sawing of cap wafer 130 along lines 136 without damaging underlying structures such as external terminals 124. After sawing cap wafer 130, sub-mount wafer 120 can be cut along lines 126 to separate individual packages.

Figure 2:
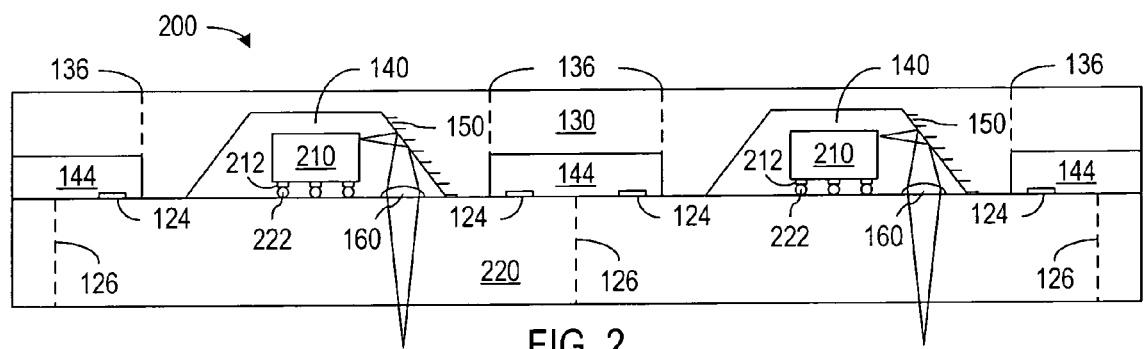
FIG. 2 shows a cross-section of a portion of a structure formed during a wafer-level packaging process for semiconductor optical devices in accordance with an embodiment of the invention employing flip-chip structures for electrical connections.

FIG. 2 illustrates a structure 200 in accordance with an alternative embodiment of the invention that uses flip-chip structures to attach lasers 210 to a sub-mount wafer 220. For flip-chip packaging, bonding pads 212 on lasers 210 are positioned to contact conductive pillars or bumps 222 on sub-mount wafer 220. Bumps 222 generally contain solder that can be reflowed to physically and electrically attach lasers 210 to wafer 220. An underfill (not shown) can also be used to enhance the mechanical integrity between laser 210 and the sub-mount wafer 220. Other than the method for attachment and electrical connection of lasers 210 to wafer 220, structure 200 is substantially the same as structure 100 as described above.

Although FIGS. 1 and 2 illustrate structures formed during a wafer-level packaging process, similar techniques can be employed for a single edge-emitting laser where a reflector redirects an optical signal from the laser through a sub-mount.

Figure 3A:
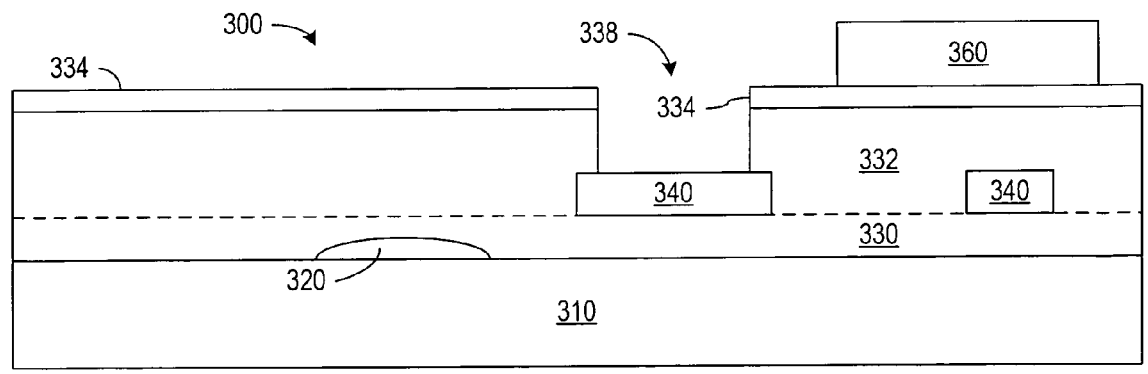
FIG. 3A shows a cross-section of a sub-mount for an optoelectronic device in accordance with an embodiment of the invention.

FIG. 3A shows a cross-section of a sub-mount 300 for an optical device package in accordance with an illustrative embodiment of the invention. For a wafer-level packaging process, sub-mount 300 would be part of a sub-mount wafer and is only separated from other similar sub-mounts after bonding the sub-mount wafer as described above. Alternatively, for fabrication of a single package, sub-mount 300 can be separated from other similar sub-mounts before an optical device chip is attached to sub-mount 300.

Sub-mount 300 can be fabricated using wafer processing techniques such as those described in a co-filed U.S. patent application Ser. No. 10/666,442, entitled "Integrated Optics And Electronics". In the illustrated embodiment, sub-mount 300 includes a silicon substrate 310, which is transparent to optical signals using long wavelength light.

On silicon substrate 310, a lens 320 is formed, for example, by building up alternating layers of polysilicon and oxide to achieve the desired shape or characteristics of a diffractive or refractive lens. A co-filed U.S. patent application Ser. No. 10/666,442, entitled "Methods to Make Diffractive Optical Elements", describes some processes suitable for fabrication of lens 320.

A planarized insulating layer 330 is formed on silicon substrate 310 to protect lens 320 and to provide a flat surface on which the metallization can be patterned. In an exemplary embodiment of the invention, layer 330 is a TEOS (tetra-ethyl-ortho-silicate) layer about 10,000 Å thick.

Conductive traces 340 can be patterned out of a metal layer, e.g., a 10,000-Å thick TiW/AlCu/TiW stack. In an exemplary embodiment, a process that includes evaporating metal onto layer 330 and a lift-off process to remove unwanted metal forms traces 340. An insulating layer 332 (e.g., another TEOS layer about 10,000 Å thick) can be deposited to bury and insulate traces 340. The insulating layer can include openings 338, which are optionally covered with Au (not shown), to provide the ability to make electrical connections using wire bonding. Any number of layers of buried traces can be built up in this fashion. A passivation layer 334 of a relatively hard and chemical resistant material such as silicon nitride in a layer about 4500 Å thick can be formed on top of the other insulating layers to protect the underlying structure. For bonding/soldering to a cap, a metal layer 360 (e.g., a Ti/Pt/Au stack about 5,000 Å thick) is formed on passivation layer 334.

Figure 3B:
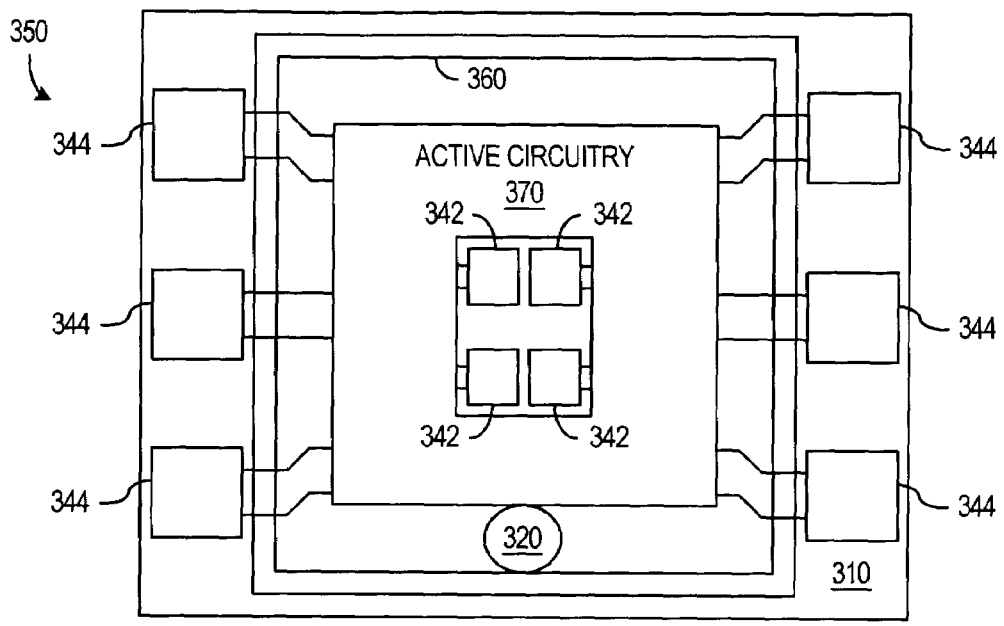
FIG. 3B shows a plan view of a sub-mount in accordance with an embodiment of the invention including active circuitry in the sub-mount.

The sub-mounts in the packages described above can incorporate passive or active circuitry. FIG. 3B illustrates the layout of a sub-mount 350 including a substrate 310 in and on which an active circuit 370 has been fabricated. Active circuit 370 can be used to process input or output signals from a chip or chips that will be attached to sub-mount 350. Substrate 310 is a semiconductor substrate on which integrated active circuit 370 can be fabricated using standard IC processing techniques. Once circuit 370 is laid down, internal pads or terminals 342 for connection to an optoelectronic device die and external bond pads or terminals 344 for connecting to the outside world are formed and connected to each other and/or active circuit 370. In the embodiment illustrated in FIG. 3B, external pads 344 accommodate I/O signals such as a power supply, ground, and data signals.

Optical element 320 is in an area of substrate 310 that is free of electronic traces or components to accommodate the reflected path of the optical signal.

Solder ring 360 for attaching a cap is formed between active circuit 370 and external bond pads 344. An individual cap that is sized to permit access to external bond pads 344 can be attached to solder ring 360. Alternatively, in a wafer-level packaging process where multiple caps are fabricated in a cap wafer, the cap wafer can be partially etched to accommodate external pads 344 before the cap wafer is attached to a sub-mount wafer.

Figure 4A:
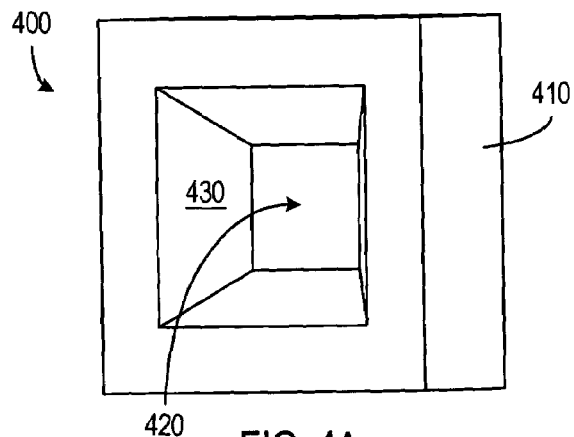
FIGS. 4A and 4B show perspective views of caps for semiconductor optical device packages in accordance with alternative embodiments of the invention.

FIG. 4A shows a perspective view of a cap 400 suitable for attachment to sub-mount 300 of FIG. 3A. Cap 400 can be fabricated using standard wafer processing techniques. In an exemplary embodiment of the invention, anisotropic etching of a silicon substrate 410 forms a cavity 420, which has a very smooth facet 430 on a <111> plane of the silicon crystal structure. At least the target facet 430 of cavity 420 is reflective or coated with a reflective material (for example, a Ti/Pt/Au metal stack). This allows facet 430 of cap 400 to act as a reflector.

Figure 4B:
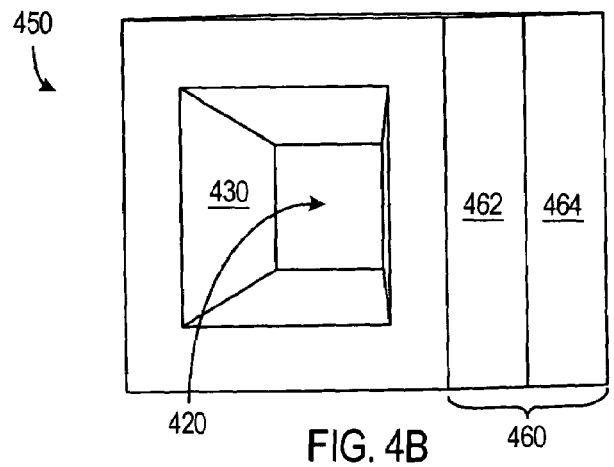

FIG. 4B shows a perspective view of a cap 450 in accordance with an alternative embodiment of the invention. Cap 450 includes a structure 460 that is composed of two layers including a standoff ring 462 and a backing plate 464. An advantage of cap 450 is that the two layers 462 and 464 can be processed differently and/or made of different materials. In particular, standoff ring 462 can be made of silicon that is etched all the way through to form a ring having planar mirror surfaces 430 at the desired angle, and backing plate 464 can be made of a material such as glass that is transparent to shorter light wavelengths.

To assemble an optical device package using sub-mount 300 and cap 400 or 450, a laser is mounted on sub-mount 300 using conventional die attach and wire-bonding processes or alternatively flip-chip packaging processes. Electrical connections to traces 340 on sub-mount 300 can supply power to the laser and convey data signals to or from the chip. Cap 400 or 450 attaches to sub-mount 300 after the laser is attached. This can be done either at the single package level or at a wafer level as described above. A hermetic seal can be obtained by patterning AuSn (or other solder) onto sub-mount 300 or cap 400, so that when the wafers are placed together, a solder reflow process creates a hermetic seal protecting the enclosed laser.

Figure 5:
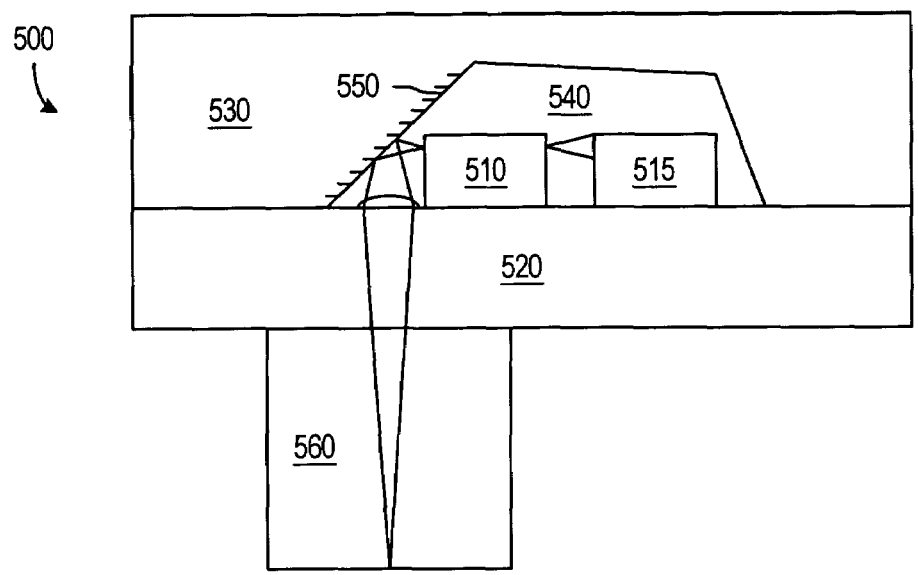
FIG. 5 shows an optical device package in accordance with an embodiment of the invention including a cap and an optical alignment post.

FIG. 5 illustrates an optical sub-assembly or package 500 in accordance with an embodiment of the invention. Package 500 includes an edge-emitting laser 510. Laser 510 is mounted on and electrically connected to a sub-mount 520 and is sealed in a cavity 540 that is hermetically sealed when a cap 530 is bonded to sub-mount 520. Cavity 540 illustrates a configuration in which cap 530 is made of silicon having a <100> plane at a 9.74° angle from its bottom and top major surfaces. Cap 540 can be wet etched so that the surface for a reflector 550 forms along a <111> plane of the silicon substrate and is therefore at a 45° angle with the major surfaces of cap 530 and sub-mount 520.

In accordance with an aspect of the invention, a monitor chip 515 is also mounted on and electrically connected to sub-mount 520. Monitor chip 515 contains a photodiode that measures the intensity of the optical signal from laser 510. This enables monitoring of the laser in laser 510 to ensure consistent output.

A post 560 is aligned to the optical signal that is emitted from chip 510 after reflection from reflector 550. In particular, post 560 can be epoxied in place on sub-mount 520 at the location that the light beam exits. Post 560 can take many forms including, but not limited to, a hollow cylinder or a solid structure such as a cylinder or a sphere of an optically transparent material. Post 560 acts as an alignment feature for aligning an optical fiber in a connector to the light emitted from the laser in package 500.

Figure 6:
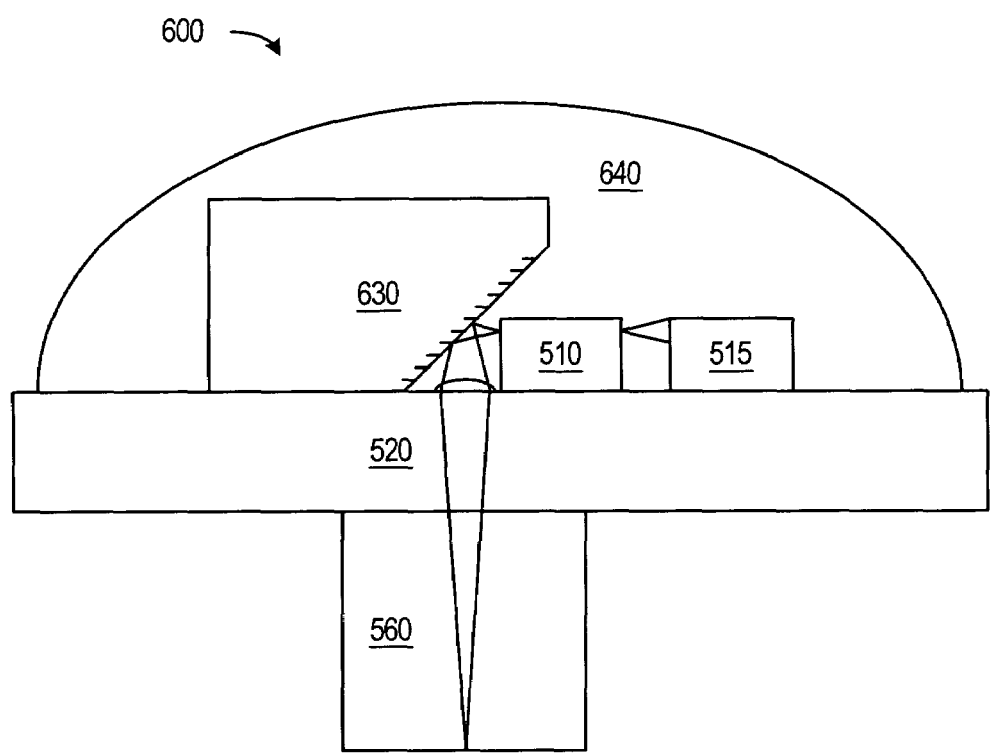
FIG. 6 shows an optical device package in accordance with an embodiment of the invention using an encapsulant and an optical alignment post.

FIG. 6 illustrates an optical sub-assembly or package 600 in accordance with an alternative embodiment of the invention. Package 600 includes chips 510 and 515 connected to a sub-mount 520 as described above. Instead of having a cap with an integrated reflector, package 600 has a reflector 630 that reflects the optical signal from laser 510 through sub-mount 520. Reflector 630 can be made of glass, silicon, or any suitable material that can be shaped and coated to provide a reflective facet having the desired orientation. Post 560 is attached to sub-mount 520 where the optical signal emerges from sub-mount 520.

An encapsulant 640 such as silicone or other suitable material that is transparent to the optical signal surrounds and protects dice 510 and 515. FIG. 6 shows encapsulant 640 encasing chips 510 and 515 and reflector, but the size and shape of encapsulant 640 can be varied. Generally, encapsulant 640 should be sufficient to cover chips 510 and 515 and to fill the space between laser 510 and reflector 630 to minimize disruption of the optical signal. Conventional techniques such as degassing and careful application of encapsulant 640 can be used to avoid disruption of the optical signal during transmission through encapsulant 640.

Figure 7:
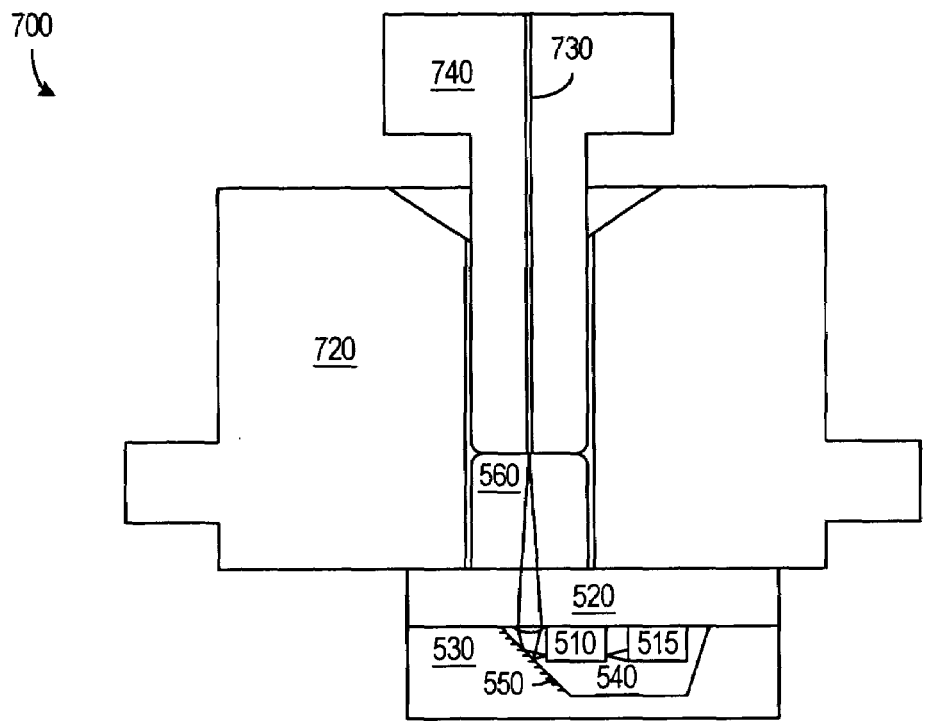
FIG. 7 shows the optical device package of FIG. 5 when assembled with a sleeve and an optical fiber connector.

FIG. 7 shows an optical assembly 700 containing sub-assembly 500 of FIG. 5. An optical assembly containing sub-assembly 600 could be of similar construction. Assembly 700 includes a sleeve 720 containing post 560 of package 500 and an optical fiber 730 in a ferrule 740. Ferrule 740 can be part of a conventional optical fiber connector (not shown). Sleeve 720 is basically a hollow cylinder having a bore that accepts both post 560 and ferrule 740. Accordingly, the inner diameter of one end of sleeve 720 can be sized to accept standard optical fiber ferrules, which can be any size but are commonly 1.25 mm or 2.5 mm in diameter. For a uniform bore as shown in sleeve 720 of FIG. 7, post 560 has a diameter that matches the diameter of ferrule 740. Alternatively, the diameter of the bore in sleeve 720 can differ at each end to respectively accommodate post 560 and ferrule 740. In yet another alternative embodiment, the functions of sleeve 720 and ferrule 740 can be combined in a single structure that contains an optical fiber (e.g., having a typical bare diameter of about 125 µm) that is aligned with an opening that accommodates post 560 (e.g., having a diameter of about 1 mm or more.)

The top surface of post 560 acts as a fiber stop and controls the "z" positions of ferrule 740 and therefore of optical fiber 730 relative to laser 510. The length of post 560 is thus selected for efficient coupling of the optical signal from package 500 into the optical fiber abutting post 560. In particular, the length of post 560 depends on any focusing elements that may be formed in and on sub-mount 520.

The fit of post 560 and ferrule 740 in sleeve 720 dictates the position in an "x-y" plane of post 560 and optical fiber 730. In this way, optical fiber 730 is centered in the x-y plane relative to post 560, thereby centering the light emitted from laser 510 on optical fiber 730. Accordingly, proper positioning of a post 560 having the desired length during manufacture of package 500 simplifies alignment of optical fiber 730 for efficient coupling of the optical signal.

Figure 8:
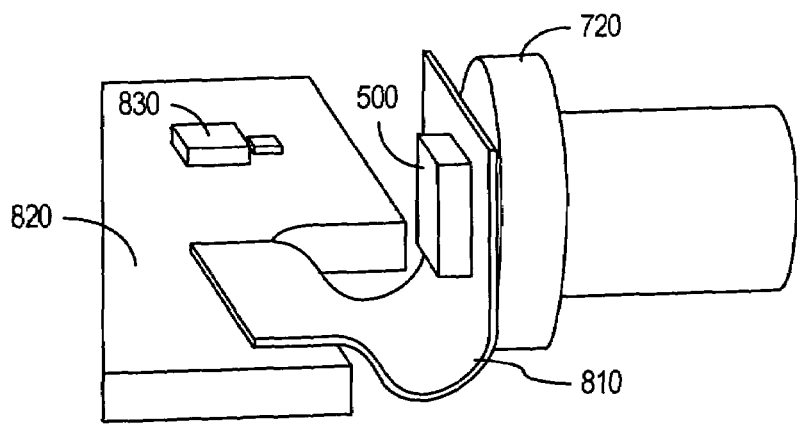
FIG. 8 shows an embodiment of the invention in which an optical assembly connects to a rigid circuit board via a flexible circuit board.

External terminals package 500 or 600 are generally connected to a circuit board containing other components of an optical transmitter or an optical transceiver. FIG. 8 shows an embodiment of the invention in which terminals on the top surface of the package connect to a flexible circuit 810. Flexible circuit 810 is generally a flexible tape or substrate containing conductive traces that can be soldered to external terminals of package 500 or 600. A hole can be made through flexible circuit 810 to accommodate protruding structures such as the cap 530 or encapsulant 640 of the package 500 or 600. A rigid circuit board 820 on which other components 830 of the optical transmitter or transceiver are mounted electrically connects to the optoelectronic device in package 500 or 600 through the flexible circuit 810 and the sub-mount in the package. In an alternative embodiment of the invention, external terminals of a package 500 or 600 can be directly connected to a rigid circuit board, provided that the resulting orientation of sleeve 720 is convenient for an optical fiber connector.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A device comprising:
   a sub-mount wafer portion having opposing first and second surfaces, the sub-mount wafer portion containing conductive traces exposed at the first surface of the sub-mount wafer portion;
   a cap wafer portion attached to the sub-mount wafer portion to form a package, the cap wafer portion having opposing first and second surfaces, the first surface of the cap wafer portion being bonded to the first surface of the sub-mount wafer portion;
   a die mounted on the first surface of the sub-mount wafer portion and containing an edge-emitting laser that is electrically coupled to the conductive traces, the cap wafer portion having a cavity formed therein at the first surface of the cap wafer portion, the die disposed in the cavity; and
   a reflector defined by reflective surfaces of walls of the cavity, the reflector positioned to reflect an optical signal from the edge-emitting laser in a reflected direction toward the first surface of the sub-mount wafer portion and through the sub-mount wafer portion, wherein the optical signal emerges in the reflected direction from the second surface of the sub-mount wafer portion.

2. The device of claim 1, further comprising an alignment post attached to the sub-mount wafer portion where the optical signal emerges from the sub-mount wafer portion.

3. The device of claim 1, further comprising a lens in the path of the optical signal.

4. The device of claim 3, wherein the lens is integrated in the sub-mount wafer portion along the path of the optical signal.

5. The device of claim 3, wherein the lens comprises a diffractive optical element.

6. The device of claim 1, wherein the cap wafer portion attaches to the sub-mount wafer portion to hermetically seal the die in the cavity.

7. A process comprising:
   mounting a die containing a laser on a first surface of a sub-mount wafer portion;
   electrically connecting the laser to electrical traces on a first surface of the sub-mount wafer portion; and
   attaching a cap wafer portion to the sub-mount wafer portion to form a packaged optical device by bonding a first surface of the cap wafer portion to the first surface of the sub-mount wafer portion, the cap wafer portion having a cavity formed therein at the first surface of the cap wafer portion, the cap wafer portion having a reflector defined by reflective surfaces of walls of the cavity, the reflector oriented in a position such that an optical signal from the laser is reflected in a reflected direction toward the first surface of the sub-mount wafer portion and through the sub-mount wafer portion, wherein the optical signal emerges in the reflected direction from a second surface of the sub-mount wafer portion opposing the first surface of the sub-mount wafer portion.

8. The process of claim 7, further comprising attaching an alignment post to the sub-mount wafer portion where the optical signal emerges.

9. The process of claim 7, wherein the laser is an edge-emitting laser.

10. The process of claim 7, wherein electrically connecting the laser comprises connecting a plurality of lasers to the sub-mount wafer portion.

11. The process of claim 10, further comprising, after attaching the cap wafer portion to the sub-mount wafer portion to form a package, cutting the package to separate the sub-mount wafer portion from similar sub-mount wafer portions and separate the cap wafer portion from similar cap wafer portions.

12. The device of claim 1, further comprising an alignment post attached to the second surface of the sub-mount wafer portion where the optical signal emerges from the sub-mount wafer portion.

13. The device of claim 1, wherein the first surface of the sub-mount wafer portion is substantially planar.

* * * * *